(12) United States Patent
Sonde et al.

(10) Patent No.: US 11,670,616 B2
(45) Date of Patent: Jun. 6, 2023

(54) MODIFIED DIRECT BOND INTERCONNECT FOR FPAS

(71) Applicants: Sushant Sonde, Westmont, IL (US); Yong Chang, Naperville, IL (US); Silviu Velicu, Willowbrook, IL (US)

(72) Inventors: Sushant Sonde, Westmont, IL (US); Yong Chang, Naperville, IL (US); Silviu Velicu, Willowbrook, IL (US)

(73) Assignee: EPIR, INC., Bolingbrook, IL (US)

( * ) Notice: Subject to any disclaimer, the term of this patent is extended or adjusted under 35 U.S.C. 154(b) by 0 days.

(21) Appl. No.: 17/354,859

(22) Filed: Jun. 22, 2021

(65) Prior Publication Data

US 2022/0052020 A1     Feb. 17, 2022

Related U.S. Application Data

(60) Provisional application No. 63/042,402, filed on Jun. 22, 2020.

(51) Int. Cl.
*H01L 23/00* (2006.01)
*H01L 27/146* (2006.01)

(52) U.S. Cl.
CPC .............. *H01L 24/81* (2013.01); *H01L 24/13* (2013.01); *H01L 24/16* (2013.01); *H01L 27/1469* (2013.01); *H01L 27/14634* (2013.01); *H01L 27/14636* (2013.01); *H01L 2224/13109* (2013.01); *H01L 2224/16145* (2013.01); *H01L 2224/81013* (2013.01); *H01L 2224/81895* (2013.01); *H01L 2224/81896* (2013.01)

(58) Field of Classification Search
CPC ............... H01L 24/81; H01L 27/14634; H01L 27/14636; H01L 27/1469
See application file for complete search history.

(56) References Cited

U.S. PATENT DOCUMENTS 5,196,703 A    3/1993  Keenan
5,431,328 A    7/1995  Chang et al.
(Continued)

OTHER PUBLICATIONS

Guilian Gao, Laura Mirkarimi, Gill Fountain, Lian Wang, Cyprian Uzoh, Thomas Workman, Gabe Guevara, Chandrasekhar Mandalapu, Bongsub Lee, Rajesh Katkar, Scaling Package Interconnects Below 20μm Pitch with Hybrid Bonding, 2018, San Jose, CA.
(Continued)

*Primary Examiner* — Dale E Page
*Assistant Examiner* — Wilner Jean Baptiste
(74) *Attorney, Agent, or Firm* — Erickson Law Group, PC

(57) ABSTRACT

A method of hybridizing an FPA having an IR component and a ROIC component and interconnects between the two components, includes the steps of: providing an IR detector array and a Si ROIC; depositing a dielectric layer on both the IR detector array and on the Si ROIC; patterning the dielectric on both components to create openings to expose contact areas on each of the IR detector array and the Si ROIC; depositing indium to fill the openings on both the IR detector array and the Si ROIC to create indium bumps, the indium bumps electrically connected to the contact areas of the IR detector array and the Si ROIC respectively, exposed on a top surface of the IR detector array and the Si ROIC; activating exposed dielectric layers on the IR detector array and the Si ROIC in a plasma; and closely contacting the indium bumps of the IR detector array and the Si ROIC by bonding together the exposed dielectric surfaces of the IR detector array and the Si ROIC. Another exemplary method provides a pillar support of the indium bumps on the IR detector array rather than a full dielectric layer support. Another exemplary method includes a surrounding dielectric edge support between the IR detector array and the Si ROIC with the pillar supports.

14 Claims, 14 Drawing Sheets

(56) References Cited

U.S. PATENT DOCUMENTS

| | | |
|---|---|---|
| 7,462,831 B2 | 12/2008 | Gooch et al. |
| 8,247,771 B2 * | 8/2012 | Ouvrier-Buffet ......... G01J 5/04 |
| | | 250/493.1 |
| 9,093,444 B2 * | 7/2015 | Gooch .................... H01L 23/10 |
| 9,410,850 B2 | 8/2016 | Novotny et al. |

OTHER PUBLICATIONS

F. Rieutord, F. Fournel, H. Moriceau, V. Larrey, C. Morales, C. Mauguen, C. Bridoux,From direct bonding mechanism to 3D applications, 2018, pp. 175-178, Grenoble France.

Liang Wang, Gill Fountain, Bongsub Lee, Guilian Gao, Cyprian Uzoh, Scott McGrath, Paul Enquist, Sitaram, Arkalgud, Laura Mirkarimi, Direct Bond Interconnect (DBI®) for Fine-Pitch Bonding in 3D and 2.SD Integrated Circuits, Jan. 10, 2023 at 16:43:08.

Johann Knechtel, Ozgur Sinanoglu, Ibrahim (Abe) M. Elfadel, Jens Lienig, Cliff C. N. Sze, Large-Scale 3D Chips: Challenges and Solutions for Design Automation, Testing, and Trustworthy Integration, Aug. 2017, vol. 10, 45-62.

Velicu, Silviu, Lee, Tae-Seok, Ashokan, Renganathan, Grein, Christoph, Boieriu, Paul et al. Monolithically integrated HgCdTe focal plane arrays, Dec. 27, 2019, pp. 15-32, vol. 5209, Bolingbrook, Illinois.

Caccia, Massimo, The Challenge of Hybridization, 2001, pp. 195-199, Como, Italy.

* cited by examiner

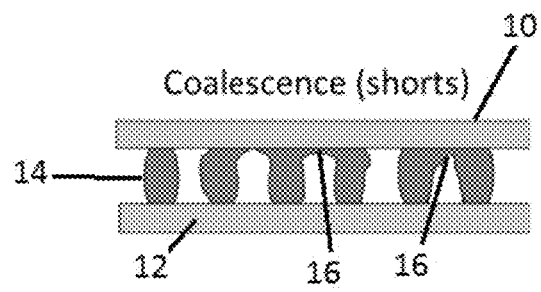
FIG. 1(a)
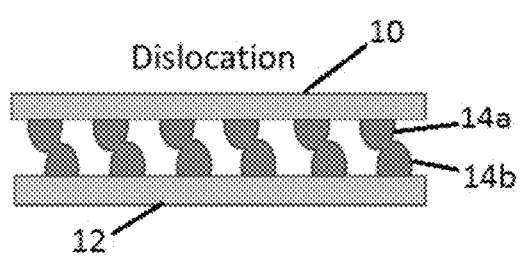
FIG. 1(b)
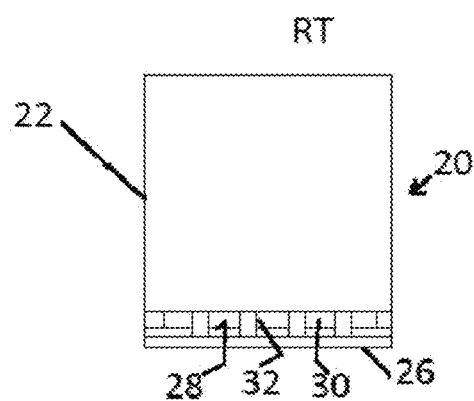
FIG. 1(c)
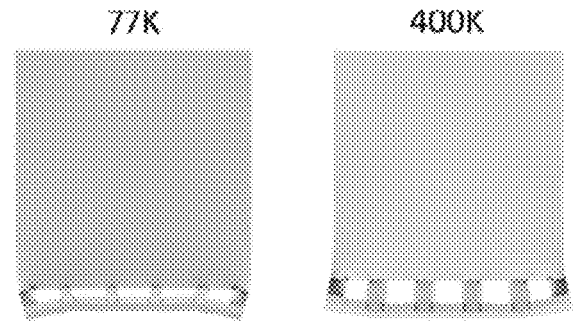
FIG. 1(d)
FIG. 1(e)

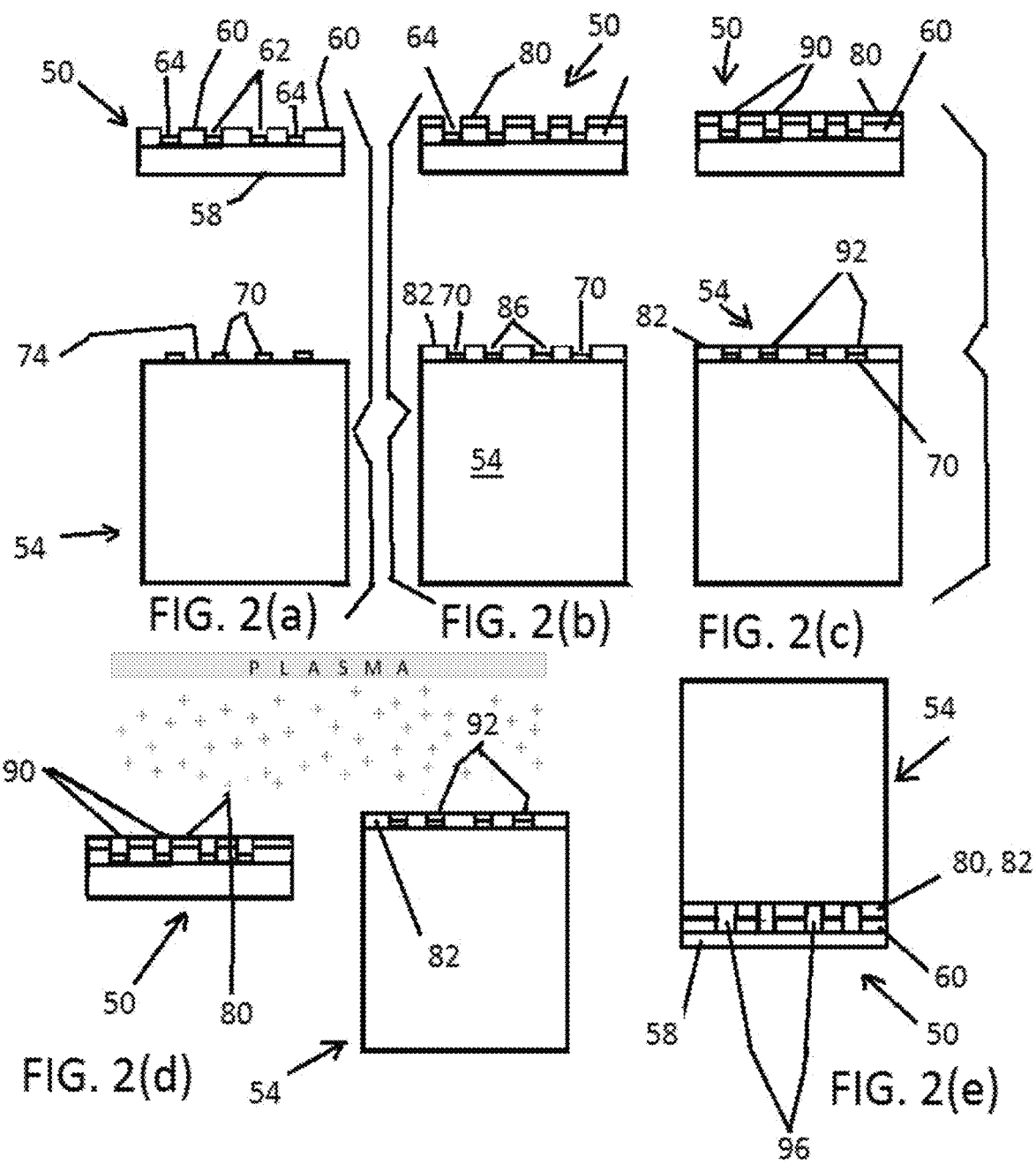

MODIFIED DIRECT BOND INTERCONNECT FOR FPAS

This application claims the benefit of U.S. Provisional Application 63/042,402 filed Jun. 22, 2020.

BACKGROUND

A hybrid detector array includes a detector array, such as a pixel detector array, and a readout integrated circuit (ROIC) manufactured separately and subsequently coupled together by electrical interconnects. Owing to the manufacturing constraints and incompatible intrinsic material properties between the detector array and the ROIC, hybrid detectors rely on the heterogeneous integration of silicon (Si) with other materials. This is especially evident in case of pixel, infrared (IR) detector arrays.

Typically, the hybridization process of such pixel detector systems is required to satisfy stringent conditions, such as—high yield, long term reliability, mechanical stability, thermal compliance and robustness while ensuring low passive mass is added to the system, yet resulting into an overall cost-effective solution.

Hybridization of IR detectors evolved from solder bump technology, to the use of indium microbump technology. Over the past many years, this technology has been refined for applications for infrared devices and detector arrays. Current indium bump bond technology is used on both the ROIC and detector array assemblies with almost 100 percent yield. More importantly, the use of indium helps in withstanding the thermal fatigue that the focal plane arrays (FPAs) go through during the routine thermal cycling of the IRFPAs.

However, indium microbump technology isn't without its limitations or issues. Common failure modes of indium interconnects (as shown in FIGS. 1(*a*), 1(*b*), 1(*d*) and 1(*e*)) can be categorized as:
  (i) Failure due to fabrication process errors, such as bump height inconsistency and excess indium metal residue being left behind during bump fabrication process, thus giving rise to coalescence or shorts between the neighboring bumps,
  (ii) Failure due to shear stresses that the interconnects experience during routine thermal cycling of the IRFPAs.

The aforementioned failures can typically be exacerbated during thermal cycling, baking and vibration leading to major failures. Also, considering the desire for higher spatial resolution of the detector array in order to resolve smaller features, the number of pixels needs to be increased while being limited by the vertical interconnect pitch density between the focal plane and the Si read out chip (ROIC) underneath.

As such, the indium microbump technology that currently relies on lift-off processes inherently limits the interconnect density and poses manufacturing challenges for high spatial resolution, and large bump arrays.

Shear stress failures are quite typical and cannot be avoided since all FPAs have to routinely go through thermal cycling. The ROIC and detector arrays are seldom made of the same material, meaning that they may have vastly different coefficients of thermal expansion, which leads to deformations in the FPA assembly. Excess deformations can lead to fatal failures.

The ever-increasing demands on performance, functionality and power consumption on Si microelectronics has made desirable three-dimensional (3D) integration of electronic chips. Typically, the Si 3D chips can be classified into four categories: i) traditional and package stacking, ii) interposer stacks, iii) through-silicon via (TSV)-based 3D ICs, and iv) monolithic 3D ICs.

It is noted that the connectivity and integration density increases from category i) to category iv). The current indium microbump technology for IRFPA hybridization can be categorized as a variant of the "traditional and package stacking." In that regard, this current implementation is the least scalable option. The category that offers the highest density solution is the monolithic 3D IC solution. Such monolithic 3D integration techniques have been heretofore implemented for IRFPA hybridization. However, despite providing the highest density of interconnects, due to the constraint that the active layers be sequentially manufactured rather than bonded using separate dies, monolithic integration poses technological issues when implementing for IRFPA hybridization.

One such technology that offers very fine pitch interconnect in Si technology and would be beneficial in IR-FPA hybridization is called Direct Bond Interconnect (DBI).

Much progress has been made in understanding and implementation of DBI into silicon IC integration technology. DBI bonding is demonstrated in both Wafer-to-Wafer and Die-to-Wafer bonding configurations. The direct bond cycle typically starts with direct oxide bonding with placing wafers into contact at room temperature in ambient followed by the formation of strong covalent bond by processes such as:

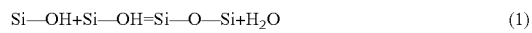
$$\text{Si—OH} + \text{Si—OH} = \text{Si—O—Si} + \text{H}_2\text{O} \tag{1}$$

or

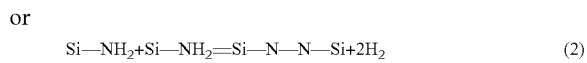
$$\text{Si—NH}_2 + \text{Si—NH}_2 = \text{Si—N—N—Si} + 2\text{H}_2 \tag{2}$$

Chemical activation of the mating surfaces (by for example plasma treatment prior to bonding) allows removal of chemical byproducts from the bond interface at low temperatures that results in a corresponding increase in bond strength and reduction in voids at the bond interface. Subsequent to this process, a metal interconnect is formed (Cu-to-Cu in most applications) during a subsequent low temperature anneal (150-300° C.). DBI is scalable to the lithography and alignment manufacturing capabilities of any application and was demonstrated at an interconnect pitch of 2 μm. By joining the dielectric regions and the metal interconnect regions on each wafer, DBI can provide both mechanical support and dense electrical interconnects between a wafer pair.

The present inventors have recognized that it would be desirable to provide a method for the scaling of indium bump separation for high spatial resolution indium bumps to avoid coalescence and shorts and to reduce shear stresses during thermal cycling of the FPAs.

The present inventors have recognized that it would be desirable to provide an improved Direct Bond Interconnect (DBI) method for FPA hybridization.

SUMMARY

Exemplary methods according to the invention makes an effort to improve upon high integration density and scalability, but at the same time, allows for heterogeneous integration for the IRFPA hybridization process. The exemplary methods are effective at reducing thermal stress and provide for high density interconnects without coalescence or shorts with neighboring interconnects by providing dielectric material around indium bump interconnects, such as by providing a dielectric layer or dielectric pillars.

An exemplary method of the invention provides a Modified Direct Bond Interconnect (MoDiBI) method—which, in principle, can be broadly applicable to various focal plane genre, such as HgCdTe; GaAs, GaSb and InSb. MoDiBI requires minimal process modifications when applied to HgCdTe IRFPA hybridization. As intended, this technology allows for favorably addressing the reliability issues in the current indium bump bond technology. Specifically, MoDiBI allows for high density indium microbumps for high resolution IRFPA applications without shorts in the neighboring bumps. Also, as is evident from the FEM models in this study, MoDiBI allows for reducing the thermal stress induced in the hybridized assembly during thermal cycling, thus helping in reducing the fatal failures experienced by IRFPAs.

An exemplary method of hybridizing an FPA having an IR component and a ROIC component and interconnects between the two components, includes the steps of:
 providing an IR detector array and a Si ROIC;
 depositing a dielectric layer on both the IR detector array and on the Si ROIC;
 patterning the dielectric on both components to create openings to expose contact areas on each of the IR detector array and the Si ROIC;
 depositing indium to fill the openings on both the IR detector array and the Si ROIC to create indium bumps, the indium bumps electrically connected to the contact areas of the IR detector array and the Si ROIC respectively and exposed on a top surface of the IR detector array and the Si ROIC;
 activating exposed dielectric layers on the IR detector array and the Si ROIC in a plasma; and
 closely contacting the indium bumps of the IR detector array and the Si ROIC while bonding together the exposed dielectric surfaces of the IR detector array and the Si ROIC.

Another exemplary method of hybridizing an IRFPA having an IR component and a ROIC component and interconnects between the two components, includes the steps of:
 providing an IR detector array with first electrical contacts and a Si ROIC with second electrical contacts;
 depositing a dielectric layer on the IR detector array;
 patterning the dielectric layers on the IR detector array to create openings to expose the first electrical contacts;
 depositing indium to fill the openings on the IR detector array in electrical contact with the first electrical contacts to create first indium bumps, and depositing indium on the second electrical contacts of the Si ROIC to create second indium bumps, the first and second indium bumps exposed on mating surfaces of the IR detector array and on the Si ROIC; and
 closely contacting the indium bumps of the IR detector array and the Si ROIC to form electrical interconnects between the IR detector array and the Si ROIC.

This method may include the step of when depositing indium on the second electrical contacts of the Si ROIC to create second indium bumps, the second indium bumps extend from a surface of the Si ROIC without a surrounding dielectric.

This method may include the step of when patterning the dielectric layers on the IR detector array, the dielectric layer is pattered to create spaced apart pillars, each pillar surrounding a first indium bump.

This method may include the step of when patterning the dielectric layer on the IR detector array a first dielectric edge support is deposited on the IR detector array; and a second dielectric edge support is also deposited on the Si ROIC. The first and second dielectric edge supports have matching sizes and shapes, and are activated in a plasma.

When closely contacting the indium bumps of the IR detector array and the Si ROIC, the first and second dielectric edge supports are bonded.

The step of closely contacting the indium bumps and the IR detector array includes a flip-chip process.

The IR detector array and a Si ROIC may be annealed after the indium bumps are contacted.

The dielectric layer can be composed of $Al_2O_3$ or $SiO_2$.

Numerous other advantages and features of the present invention will become readily apparent from the following detailed description of the invention and the embodiments thereof, and from the accompanying drawings.

BRIEF DESCRIPTION OF THE DRAWINGS

FIG. 1(a) is a schematic cross-sectional drawing of wafers electrically connected by indium microbumps showing fabrication errors causing coalescence and electrical shorts;

FIG. 1(b) is a schematic cross-sectional drawing of wafers electrically connected by indium microbumps showing fabrication errors causing dislocations;

FIG. 1(c) is a schematic cross-sectional drawing of a hybridized IRFPA electrically connected by indium microbumps at room temperature;

FIG. 1(d) is a schematic cross-sectional drawing of a hybridized IRFPA electrically connected by indium microbumps showing error caused by thermal cycling at 77° K;

FIG. 1(e) is a schematic cross-sectional drawing of a hybridized IRFPA electrically connected by indium microbumps showing error caused by thermal cycling at 400° K;

FIG. 2(b) is a sectional view of the embodiment of FIG. 2(a) in a second stage of processing;

FIG. 2(c) is a sectional view of the embodiment of FIG. 2(a) in a third stage of processing;

FIG. 2(d) is a sectional view of the embodiment of FIG. 2(a) in a fourth stage of processing;

FIG. 2(e) is a sectional view of the embodiment of FIG. 2(a) in a fifth stage of processing;

FIG. 2AA is an enlarged view of FIG. 2(e);

DETAILED DESCRIPTION

Figure 2A:
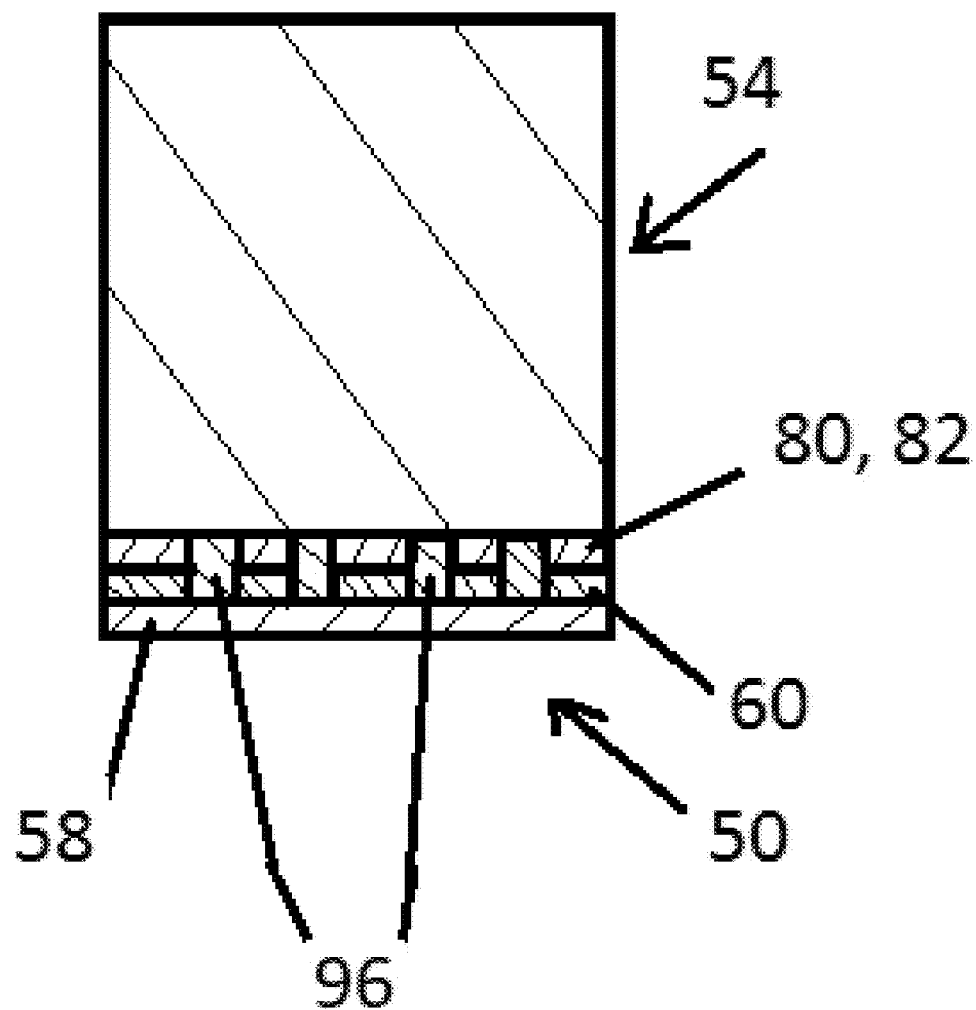
FIG. 2(a) is a sectional view of an embodiment IR detector array and a Si ROIC in a first stage of processing.

While various embodiments of the present invention have been described, it should be understood that other modifications and alternatives can be made without departing from the spirit and scope of the invention which should be determined from the appended claims. It is to be understood that no limitation with respect to the specific apparatus illustrated herein is intended or should be inferred.

This application incorporates by reference U.S. Provisional Application 63/042,402 filed Jun. 22, 2020 in its entirety.

FIGS. 1(a) through 1(c) illustrate common failure modes in indium microbump technology. Failures due to errors in fabrication process are shown in FIGS. 1(a) and 1(b). FIG. 1(a) shows a top wafer 10 and bottom wafer 12 connected together by iridium microbumps 14. Coalescence error causes electrical shorts 16 between microbumps 14. FIG. 1(b) shows bump dislocations between upper microbumps 14a and lower microbumps 14b.

FIG. 1(c) shows a traditional hybridized FPA 20 at room temperature. The FPA 20 includes a ROIC 22 and a focal plane array (FPA) 26 covered by a patterned Zinc Sulfide (ZnS) layer 28 with windows 30. The ROIC 22 is electrically connected to the FPA 26 by microbumps 32 that extend through the windows 30. FIGS. 1(d) and 1(e) show failures due to thermal cycling of the hybridized IRFPA of FIG. 1(c). FIG. 1(d) shows the Hybridized FPA of FIG. 1(c) at a raised temperature of 77° K and FIG. 1(e) shows the Hybridized FPA of FIG. 1(c) at a raised temperature of 400° K. The illustrated distortions are due to thermal coefficient mismatch of the materials used in the hybrid assembly.

FIGS. 2(a) through 2(e) illustrates process steps for a modified direct bond interconnect process as applied to an IRFPA. FIG. 2(a) shows the starting components to be a prefabricated IR detector array 50 and a Si ROIC 54. The array 50 includes a detector 58, a pattered surface layer of ZnS 60 on the detector that defines windows 62 open to electrical connects 64 on the detector 58. The Si ROIC 54 includes electrical connects 70 on a top surface 74 thereof in a pattern corresponding to the electrical connects 64 of the detector 58. The heights of the connects 64, 70 are shown exaggerated for purposes of explanation in FIGS. 2(a)-2(d). The connects 64, 70 are not shown in FIG. 2(e).

FIG. 2(b) shows a dielectric layer 80 (e. g. oxide, nitride or oxynitride) deposited on the layer 60 patterned to expose the electrical connects 64 through the windows 62 and a dielectric layer 82 (e. g. oxide, nitride or oxynitride) deposited on the top surface 74 of the Si ROIC 54 pattered to form windows 86 that expose the electrical connects 70.

FIG. 2(c) shows indium deposited on these components within the windows 62 and within the windows 86, flush with top surfaces of the dielectric layers 80, 82, forming microbumps 90 on the FPA 50 and microbumps 92 on the Si ROIC 54.

FIG. 2(d) shows the dielectric regions 80, 82 are then activated with treatment in plasma.

FIG. 2(e) shows the activated surfaces 80, 82 are then aligned and bonded together by a flip-chip process at room temperature. The microbumps 90, 92 are aligned and in electrical contact. The entire assembly can be annealed at higher temperatures, if necessary, in order to correct for any discontinuities in the metal interconnects 96 formed by the microbumps 90, 92.

FIG. 2AA is an enlarged view of FIG. 2(e).

FIG. 2 can depict the implementation of MoDiBI as applied to HgCdTe based IRFPA hybridization process. A prefabricated HgCdTe detector 50 array and a Si ROIC 54 receive deposition of a dielectric layer such as either oxide, nitride or oxynitride. Such dielectric layer will then be patterned to open windows 62 in order to get access to the contacts 64 on the HgCdTe detector pixels and the contacts 70 on the Si circuitry on the ROIC 54. This is followed by a lithography step and lift-off process to pattern and deposit indium metal—an exemplary choice for the metal microbumps 90, 92. Subsequently, the patterned dielectric layers 80, 82 are activated by means of a plasma treatment prior to being bonded together. After activation, the two dielectric surfaces 80, 82 of the detector array 50 and Si ROIC 54 can be aligned by flip-chip process and bonded together at room temperature by minimal force. Any discontinuity in the indium interconnects 90, 92 due to any and all non-planarity and non-parallelism, potentially arising due to bow in the wafer or detector die can be mitigated in this approach by annealing the entire bonded assembly at higher temperature. At higher temperature, due to higher thermal expansion coefficient (TEC) than the mated/bonded dielectric the indium interconnect can easily expand to form indium-indium bond, forming the interconnects 96. Indium with high TEC ($33 \times 10^{-6}$/K) is suited for such application.

The failures due to coalescence and shorts can be minimized and eliminated with the use of MoDiBI process of FIGS. 2(a) through 2(e). The oxide trenches defined by the windows 62 and 86 are useful in containing the bump metal within, thus avoiding any lateral spread. Consequently, this approach will also allow for potential increase in interconnect density. Further, to assess the failures due to shear stresses experienced during thermal cycling of the IRFPA, Finite Element Method (FEM) based simulations were performed.

As a baseline, the calculated maximum stress in the HgCdTe hybridized system with traditional indium bumps at 77° K and 400° K is plotted in FIG. 3.

Figure 3A:
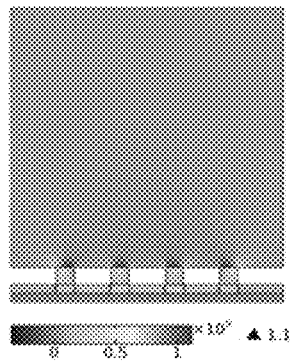
FIG. 3(a) is a two-dimensional contour plot of a sectional view of a hybridized IR detector array and a Si ROIC at 77° K.
Figure 3B:
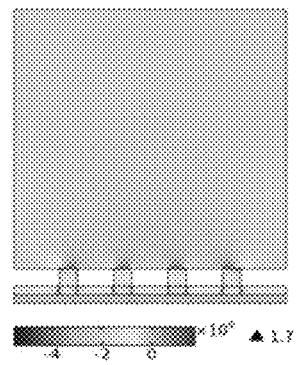
FIG. 3(b) is a two-dimensional contour plot of a sectional view of a hybridized IR detector array and a Si ROIC at 400° K.
Figure 3C:
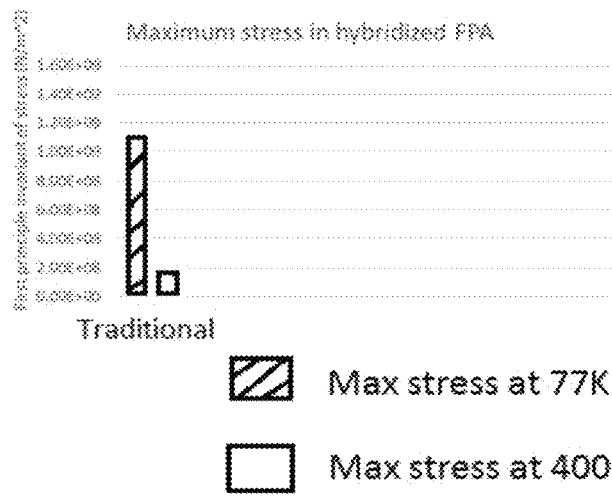
FIG. 3(c) is a bar graph of maximum stress in the hybridized FPA shown in FIGS. 3(a) and 3(b)

FIGS. 3(a) and 3(b) are two-dimensional contour plots for stress evaluated in traditional hybridized assembly comprising HgCdTe detector array and a Si ROIC such as shown in FIG. 1(c). FIG. 3(a) shows the maximum first principle invariant of stress at 77° K and FIG. 3(b) shows the maximum first principle invariant of stress at 400° K for a traditional hybridized assembly. All the structural components are as described in FIG. 2(c).

Models and related considerations employed are summarized in Table 1:

TABLE 1

Models implemented

Fourier Heat transfer (with no heat source)
$\rho C_p \nabla T + \nabla q$ (3)
$q = -k \nabla T$ (4)
$\rho$—Density of material (kg/m$^3$), $C_p$—Heat capacity (J/kg · K),
T—Temperature (K), q—Heat flux (W/m$^2$), k—Thermal conductivity (W/m · K)
Thermal expansion
$\epsilon_{th} = \alpha(T - T_{Ref})$ (5)
$\alpha$—Thermal expansion coefficient (1/K), $\epsilon_{th}$—Strain
Solid mechanics
  Linear elastic material
$\nabla \cdot s + F_v = 0$ (6)
s—Stress tensor (N/m$^2$), $F_v$—Force/volume (N/m$^3$)
  Strain due to displacement
  Strain tensor
$$\epsilon = \frac{1}{2}\left[(\nabla u)^T + (\nabla u)\right]$$ (7)

The temperature boundary conditions of 77° K and 400° K were employed in for this study.

The two-dimensional (2D) contour plots (FIGS. 3(a)-3(b)) depict stress distribution in the hybridized assembly at 77° K and 400° K respectively. The stress tends to accumulate at the interface between the indium bumps and the Si ROIC and some hotspots can be seen at the edges of this interface. In such cases it is important to look at and compare the maximum. Typically, in such reliability issues, the hotspots can lead to single isolated local breakdowns and/or cascade into a broader global breakdown. The maximum of the first principle invariant of stress (N/m$^2$) (FIG. 3(c)) is much higher (~85%) at 77° K compared to at 400° K for the traditional indium bump bonding (Table 2). For all the cases considered, the stress at 77° K is higher than at 400° K for each case. However, it is the highest for the traditional indium bump bonds. With this baseline, three structural variations of MoDiBI are presented with a view to minimize the stress levels in the hybridized assembly. The studied structural variations are as follows:

(i) All the space around the indium bumps is covered with dielectric (FIGS. 4(a)-4(d)), (ii) Only partial coverage of the dielectric layer around the indium bumps (FIG. 5(a)-5(d)) and (iii) Partial coverage of dielectric around the indium bumps and a full dielectric support at the edges (FIGS. 6(a)-6(d). The structure and process of making the embodiment of FIG. 6(a)-6(d) is described more completely in FIGS. 12(a)-14.

(iv) FIGS. 6(a)-6(d) are).

Also, for each structural variation, two representative cases are studied, each with oxides Al$_2$O$_3$ and SiO$_2$ for demonstration purpose.

Figures 4A, 4B, 4C, 4D:
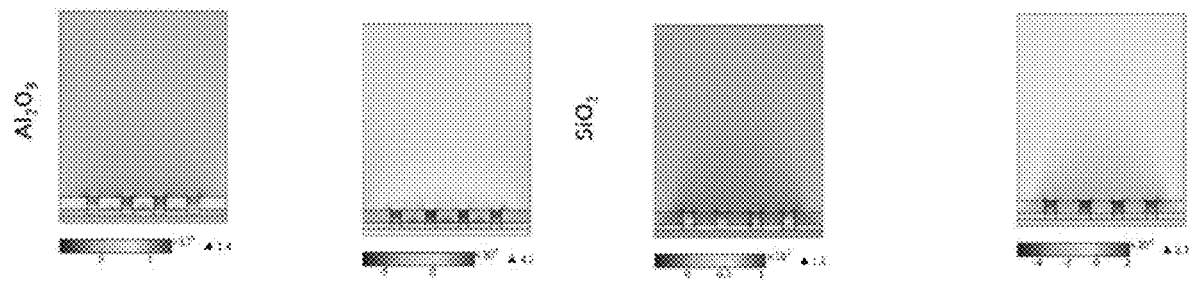
FIG. 4(a) is a two-dimensional contour plot of a sectional view of a hybridized IR detector array and a Si ROIC at 77° K with $Al_2O_3$ with full oxide coverage.
FIG. 4(b) is a two-dimensional contour plot of a sectional view of a hybridized IR detector array and a Si ROIC at 400° K with $Al_2O_3$ with full oxide coverage.
FIG. 4(c) is a two-dimensional contour plot of a sectional view of a hybridized IR detector array and a Si ROIC at 77° K with $SiO_2$ with full oxide coverage.
FIG. 4(d) is a two-dimensional contour plot of a sectional view of a hybridized IR detector array and a Si ROIC at 400° K with $SiO_2$ with full oxide coverage.
Figure 4E:
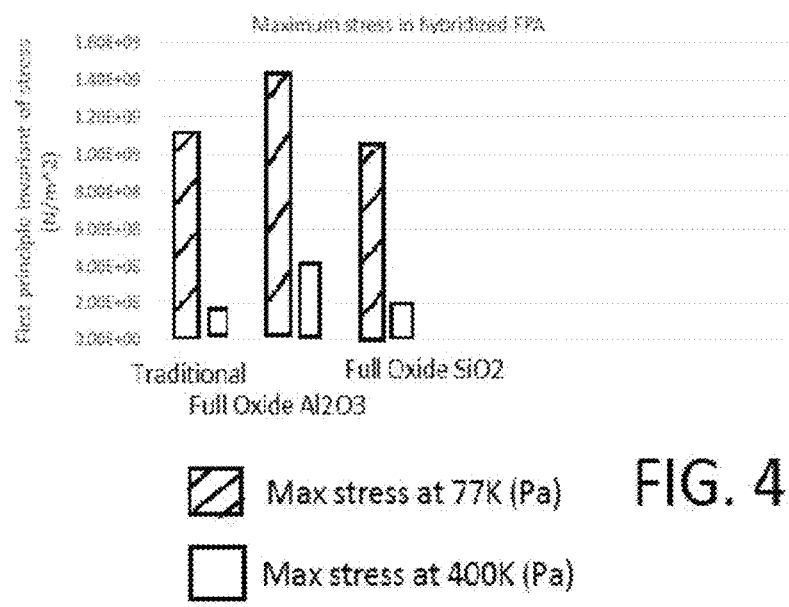
FIG. 4(e) is a bar graph of maximum stress in the hybridized FPA shown in FIG. 3(c) compared to the maximum stress in the hybridized FPA shown in FIGS. 4(a) through 4(d)

FIGS. 4(a)-4(d) are two-dimensional contour plots for stress evaluated in MoDiBI hybridized assembly comprising HgCdTe detector array, Si ROIC and full oxide coverage such as the IR detector array 50 and the Si ROIC 54 assembled together in FIG. 2(e). FIGS. 4(a) and 4(c) are taken at 77° K and FIGS. 4(b) and 4(d) are taken at 400° K. FIGS. 4(a) and 4(b) are with Al$_2$O$_3$ for the bonding dielectric layers 80, 82 and FIGS. 4(c) and 4(d) are with SiO$_2$ for the bonding dielectric layers 80, 82. FIG. 4(e) shows the maximum first principle invariant of stress at 77° K and 400° K for this case plotted in comparison with traditional hybridized assembly. All the structural components have similar meaning as shown in FIG. 2e. The assembly of FIGS. 4(a)-4(d)

The results for the first structural variation are depicted in FIGS. 4(a)-4(e). This is the most basic of MoDiBI implementation where the dielectric used for direct bond fills up all the space around indium bumps up to the edge of the hybrid assembly. From FIGS. 3(a)-3(b) and FIGS. 4(a)-4(d) demonstrate that this implementation is successful in reducing the hotspots of maximum stress from the interface of indium bumps and the Si ROIC. However, as shown in FIG. 4(e) the maximum stress in this particular hybrid assembly increased by 27.68% and 145.35% at 77° K and 400° K respectively if $Al_2O_3$ is used for the bonding dielectric layers 80, 82. This changes dramatically if $SiO_2$ is used for the bonding dielectric layers 80, 82 instead, with reduction in maximum stress of 4.46% and a modest increase of 22.67% at 77° K and 400° K respectively. It is also evident from FIGS. 4(a)-4(d), that this approach reduces stress from the interface between indium bumps and the Si ROIC, and allows for accumulation of stress in the bonded dielectric instead. However, an excess accumulation could lead to mechanical breakdown in the bonded dielectric.

To circumvent that drawback, another approach that allows for release of stress in the bonding dielectric is presented in FIGS. 5(a)-5(d). The structure and process of making the embodiment of FIG. 5(a)-5(d) is described more completely in FIGS. 7(a)-11.

Figure 5A:
FIG. 5(a) is a two-dimensional contour plot of a sectional view of a hybridized IR detector array and a Si ROIC at 77° K with $Al_2O_3$ and partial oxide coverage around indium bumps.
Figure 5B:
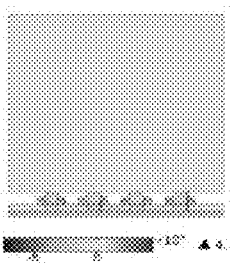
FIG. 5(b) is a two-dimensional contour plot of a sectional view of a hybridized IR detector array and a Si ROIC at 400° K with $Al_2O_3$ and partial oxide coverage around indium bumps.
Figure 5C:
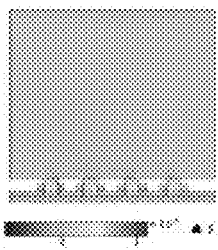
FIG. 5(c) is a two-dimensional contour plot of a sectional view of a hybridized IR detector array and a Si ROIC at 77° K with $SiO_2$ and partial oxide coverage around indium bumps.
Figure 5D:
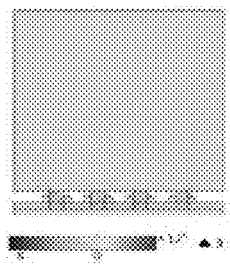
FIG. 5(d) is a two-dimensional contour plot of a sectional view of a hybridized IR detector array and a Si ROIC at 400° K with $SiO_2$ and partial oxide coverage around indium bumps.
Figure 5E:
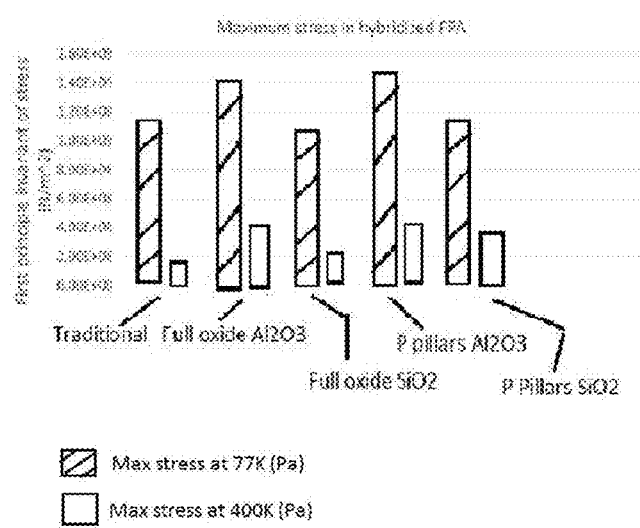
FIG. 5(e) is a bar graph of maximum stress in the hybridized FPA shown in FIGS. 3(c) and 4(e) compared to the maximum stress in the hybridized FPA shown in FIGS. 5(a) through 5(d)

FIG. 5(a) through 5(d) show two-dimensional contour plots for stress evaluated in MoDiBI hybridized assembly comprising HgCdTe detector array, a Si ROIC and partial oxide coverage around indium bumps. FIGS. 5(a) and 5(c) are taken at 77° K and FIGS. 5(b) and 5(d) are taken at 400° K. FIGS. 5(a) and 5(b) are with $Al_2O_3$ for the bonding dielectric layers 80, 82 and FIGS. 5(c) and 5(d) are with $SiO_2$ for the bonding dielectric layers 80, 82. FIG. 5(e) shows the maximum first principle invariant of stress at 77° K and 400° K for this case plotted in comparison with previous cases. All the structural components have similar meaning as shown in FIG. 2(e), except as noted.

In this approach, the dielectric coverage is reduced by only limiting it in the shape of partial pillars around the bonding indium bumps. This approach provides a container structure to avoid any shorts between neighboring indium bumps. It is evident from FIG. 5e and Table 2 demonstrate that such partial pillars approach leads to moderate increase in maximum stress at 77° K (29.46% and 0.89% for $Al_2O_3$ and $SiO_2$ respectively for the bonding dielectric layers 80, 82), but registers a very high increase of 144.19% and 116.86% for the same cases at 400° K. Such reversal in results, especially in the case of $SiO_2$ for the bonding dielectric layers 80, 82, indicates that full oxide coverage may be advantageous in order to reduce the stress level.

A hybrid approach is presented in FIGS. 6(a)-6(d). The structure and process of making the embodiment of FIG. 6(a)-6(d) is described more completely in FIGS. 12(a)-14.

Figures 6A, 6B, 6C, 6D:
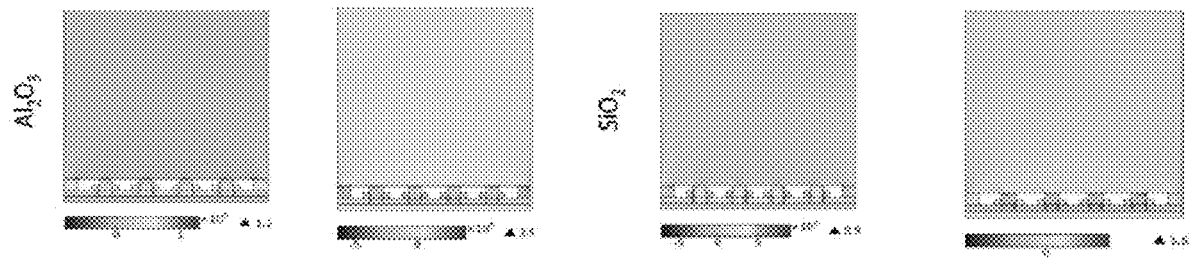
FIG. 6(a) is a two-dimensional contour plot of a sectional view of a hybridized IR detector array and a Si ROIC at 77° K with $Al_2O_3$ and partial oxide coverage around indium bumps with full support at the edges.
FIG. 6(b) is a two-dimensional contour plot of a sectional view of a hybridized IR detector array and a Si ROIC at 400° K with $Al_2O_3$ and partial oxide coverage around indium bumps with full support at the edges.
FIG. 6(c) is a two-dimensional contour plot of a sectional view of a hybridized IR detector array and a Si ROIC at 77° K with $SiO_2$ and partial oxide coverage around indium bumps with full support at the edges.
FIG. 6(d) is a two-dimensional contour plot of a sectional view of a hybridized IR detector array and a Si ROIC at 400° K with $SiO_2$ and partial oxide coverage around indium bumps with full support at the edges.
Figure 6E:
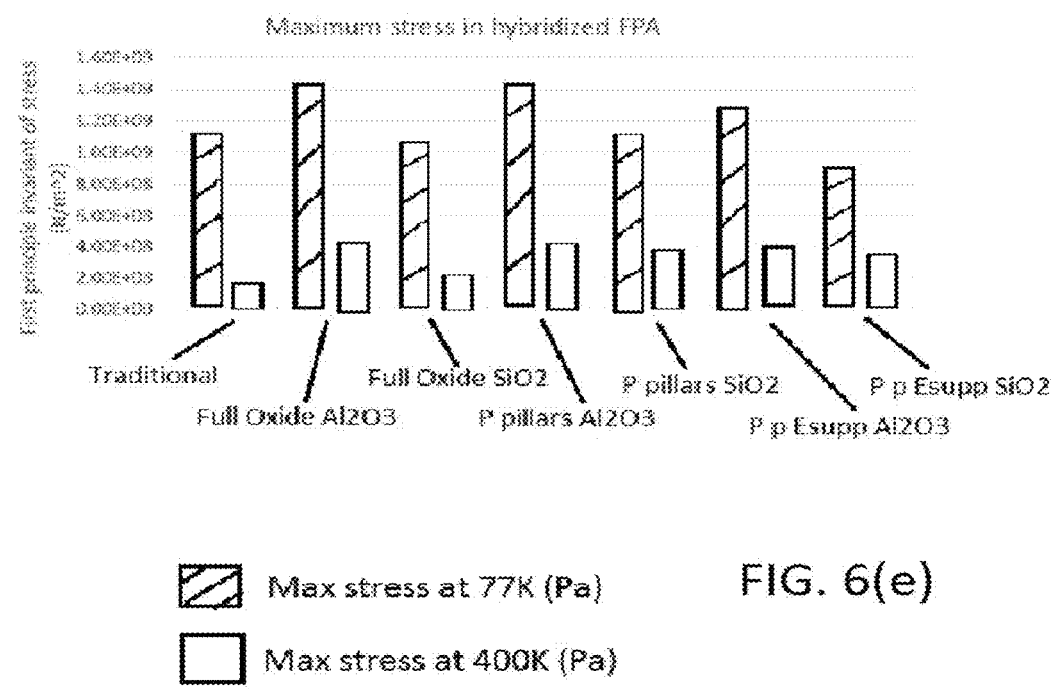
FIG. 6(e) is a bar graph of maximum stress in the hybridized FPA shown in FIGS. 3(c), 4(e) and 5(e) compared to the maximum stress in the hybridized FPA shown in FIGS. 6(a) through 6(d)

FIGS. 6(a)-6(d) are two-dimensional contour plots for stress evaluated in MoDiBI hybridized assembly comprising a HgCdTe detector array, a Si ROIC and partial oxide coverage around indium bumps with full support at the edges. FIGS. 6(a) and 6(c) are taken at 77° K and FIGS. 6(b) and 6(d) are taken at 400° K. FIGS. 6(a) and 6(b) are with $Al_2O_3$ for the bonding dielectric layers 80, 82 and FIGS. 6(c) and 6(d) are with $SiO_2$ for the bonding dielectric layers 80, 82. FIG. 6(e) shows the maximum first principle invariant of stress at 77° K and 400° K for this case plotted in comparison with previous cases. All the structural components have similar meaning as shown in FIG. 2(e), except as noted.

In this case, the partial pillars around the indium bumps are retained with an addition of full dielectric support (similar to FIGS. 4(a)-4(d)) at the edges of the hybrid assembly. As can be deduced from FIGS. 6(a)-6(d) and Table 2, this hybrid approach helps in reducing the maximum evaluated stress in comparison to the previous two cases. In fact, at 77° K this approach registers only a modest increase of 14.29% and a decrease of 19.73% for $Al_2O_3$ and $SiO_2$ respectively for the bonding dielectric layers 80, 82.

Regarding FIGS. 4(e), 5(e) and 6(e), the evaluated maximum stress for $Al_2O_3$ for the bonding dielectric layers 80, 82 cases is always higher than that of the $SiO_2$ for the bonding dielectric layers 80, 82 cases. In fact, the maximum evaluated stress, typically increases when $Al_2O_3$ is implemented for the bonding dielectric layers 80, 82 whereas use of $SiO_2$ for the bonding dielectric layers 80, 82 leads to reduction (or minor increase) in the maximum stress. The maximum stress, experienced by the hybridized system during thermal cycling may depend on the choice of materials implemented, and also on the geometrical shapes.

TABLE 2

Summary of evaluated stress in each case and their relative comparison.

| Hybridization approach | Maximum evaluated Stress (N/m^2) | | Comparison | Change from traditional approach | |
|---|---|---|---|---|---|
| | 77° K. | 400° K. | 77° K. vs 400° K. | 77° K. | 400° K. |
| 1 Traditional indium bumps | 1.12E+09 | 1.72E+08 | 84.60% | | |
| 2 Full oxide $Al_2O_3$ | 1.43E+09 | 4.22E+08 | 70.50% | 27.68% | 145.35% |
| 3 Full oxide $SiO_2$ | 1.07E+09 | 2.1E+08 | 80.30% | −4.46% | 22.67% |
| 4 Partial pillars $Al_2O_3$ | 1.45E+09 | 4.20E+08 | 71.00% | 29.46% | 144.19% |
| 5 Partial pillars $SiO_2$ | 1.13E−09 | 3.73E+08 | 67.00% | 0.89% | 116.86% |
| 6 Partial pillars + End support $Al_2O_3$ | 1.28E+09 | 3.94E+08 | 69.20% | 14.29% | 129.07% |
| 7 Partial pillars + End support $SiO_2$ | 8.99E+08 | 3.50E+08 | 61.10% | −19.73% | 103.49% | due to thermal coefficient mismatch of the materials used in the hybrid assembly.

Figures 7A, 7B, 7C:
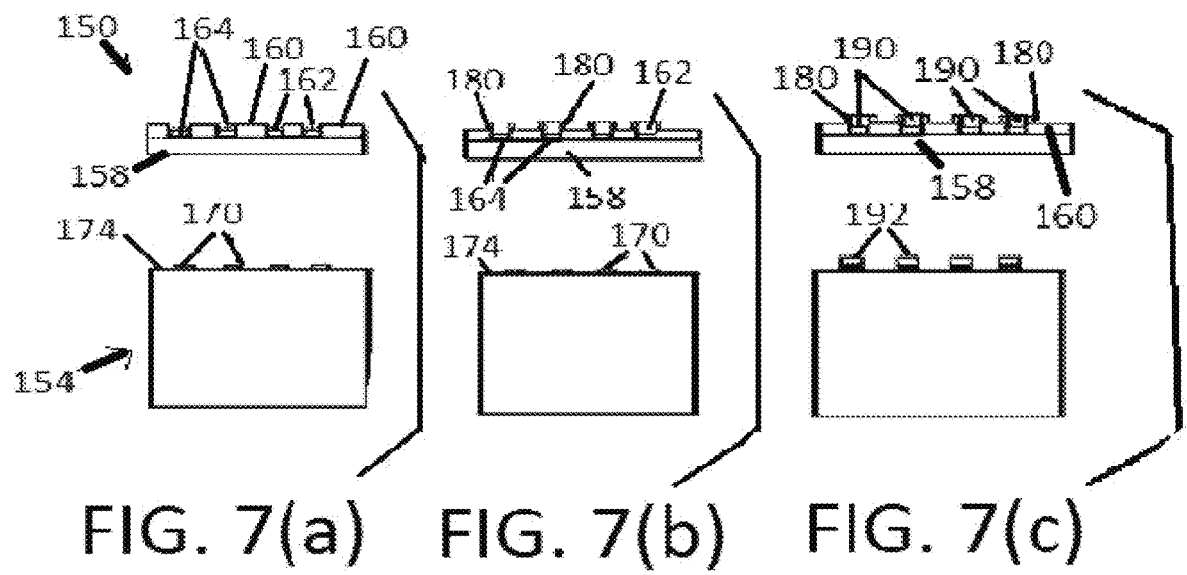
FIG. 7(a) is a sectional view of an alternate embodiment IR detector array and a Si ROIC in a first stage of processing.
FIG. 7(b) is a sectional view of the alternate embodiment of FIG. 7(a) in a second stage of processing.
FIG. 7(c) is a sectional view of the alternate embodiment of FIG. 7(a) in a third stage of processing.

FIGS. 7(a) through 7(d) illustrates process steps for a modified direct bond interconnect process as applied to an IRFPA. FIG. 7(a) shows the starting components to be a prefabricated IR detector array 150 and a Si ROIL 154. The array 150 includes a detector 158, a pattered surface layer of ZnS 160 on the detector that defines windows 162 open to electrical connects 164 on the detector 158. The Si ROIC 154 includes electrical connects 170 on a top surface 174 thereof in a pattern corresponding to the electrical connects 164 of the detector 158. The heights of the connects 164, 170 are shown exaggerated for purposes of explanation in FIGS. 7(a)-2(c). The connects 164, 170 are not shown in FIG. 7(d).

FIG. 7(b) shows a patterned dielectric layer (e. g. oxide, nitride or oxynitride) deposited on the layer 160, patterned to expose the windows 162 and the electrical connects 164 through the windows 162, and forming collars or pillars 180 with the windows 162 exposed through a central region of the pillars.

FIG. 7(c) shows indium deposited on these components within the windows 162 and flush with top surfaces of the pillars 180, such as by a lithography step and lift-off process, forming microbumps 190 on the FPA 150. Indium is also deposited and patterned on the contacts 170, such as by a lithography step and lift-off process, forming microbumps 192 on the Si ROIC 154.

Figure 7D:
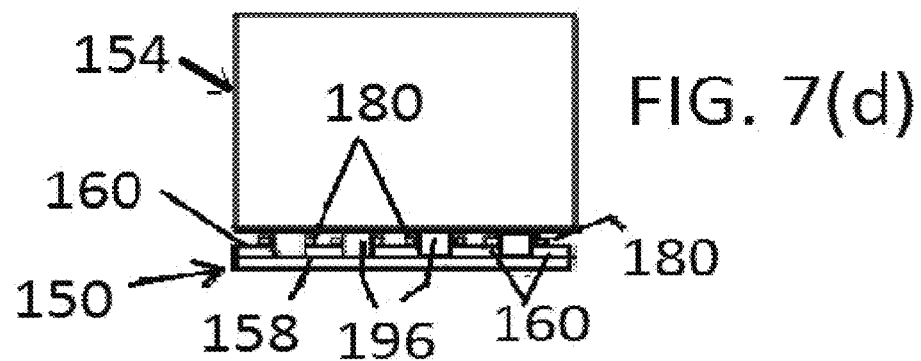
FIG. 7(d) is a sectional view of the alternate embodiment of FIG. 7(a) in a fifth stage of processing.

FIG. 7(d) shows the microbumps 190, 192 are aligned by a flip-chip process and bonded together at room temperature by minimal force. The microbumps 190, 192 are in electrical contact forming metal interconnects 196. The entire assembly can be annealed at higher temperatures, if necessary, in order to correct for any discontinuities in the metal interconnects 196 formed by the microbumps 190, 192.

FIGS. 2(a)-(d) can depict the implementation of MoDiBI as applied to HgCdTe based IRFPA hybridization process. Any discontinuity in the indium interconnects 190, 192 due to any and all non-planarity and non-parallelism, potentially arising due to bow in the wafer or detector die can be mitigated in this approach by annealing the entire bonded assembly at higher temperature. At higher temperature, the indium interconnects can easily expand to form indium-indium bonds, forming the interconnects 196. Indium with high TEC ($33 \times 10^{-6}$/K) is suited for such application.

Figure 8:
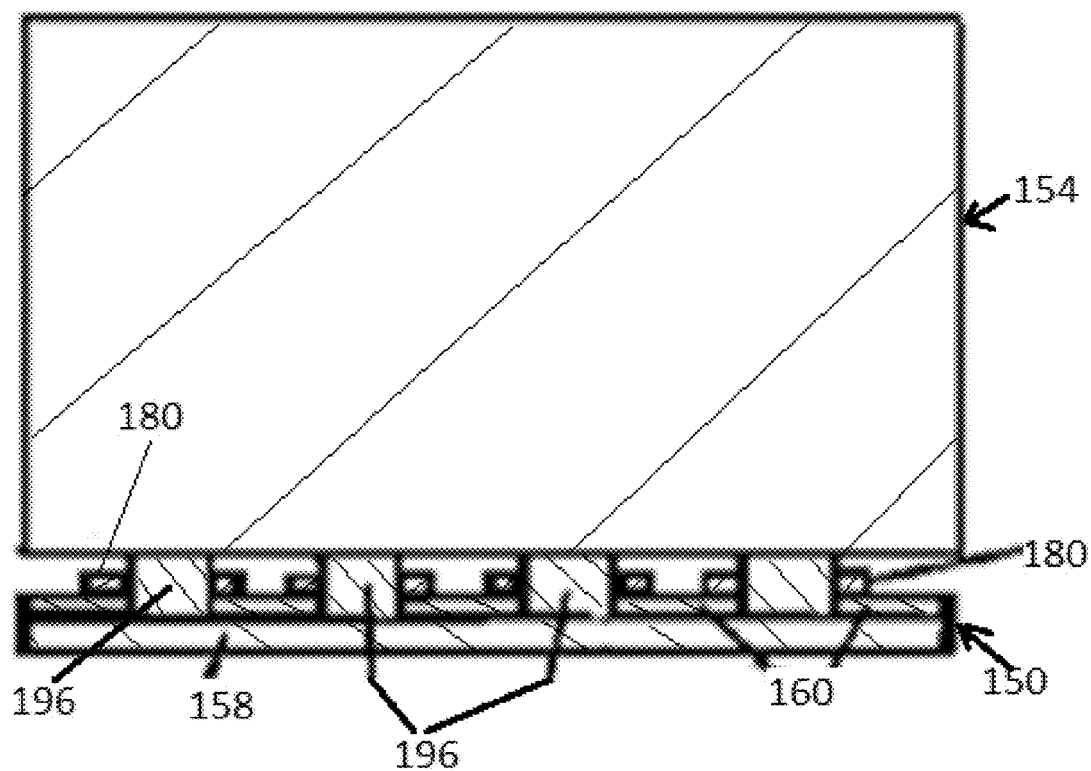
FIG. 8 is an enlarged view of FIG. 7(d)

FIG. 8 is an enlarged view of the IR detector array 150 and Si ROIC 154 shown in FIG. 7(d).

Figure 9:
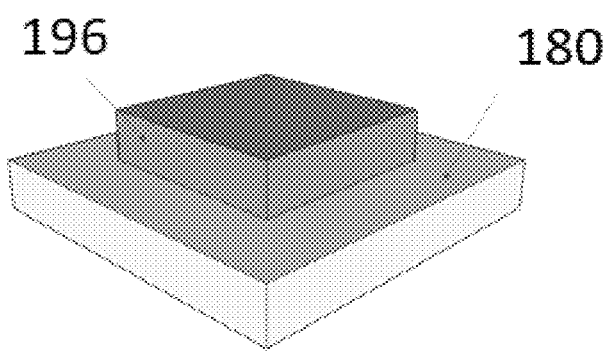
FIG. 9 is a perspective view of a portion taken from FIG. 7(d)
Figure 10:
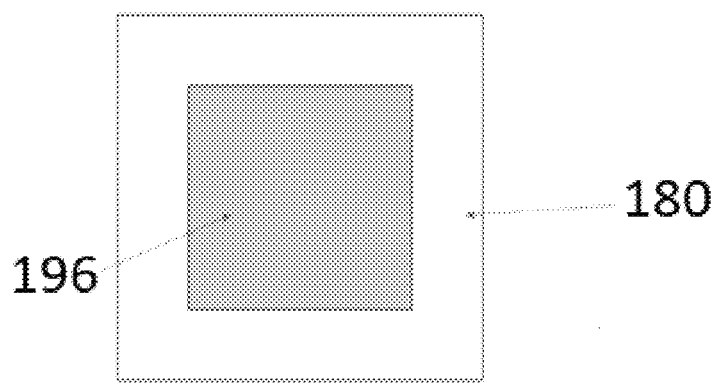
FIG. 10 is a plan view of the portion shown in FIG. 9.
Figure 11:
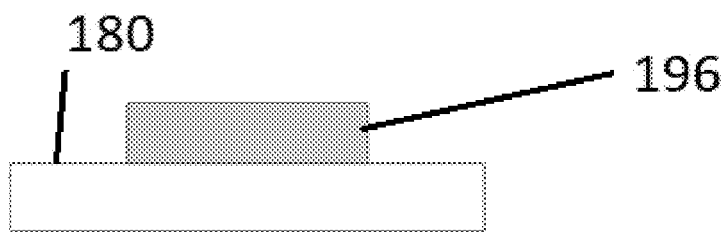
FIG. 11 is a front view of the portion shown in FIG. 9.

FIGS. 9-11 illustrate the shape of the pillars 180 and the indium interconnect 196, taken from FIG. 7(d). The pillar 180 surrounds the interconnect 196. The interconnect 196 is shown as a rectangular block but could be another shape, such as a cylinder or an elongated block or rail. The pillar 180 is also shown as a rectangular block but could also be of a different shape, such as a cylinder or an elongated block or rail.

Figure 12A:
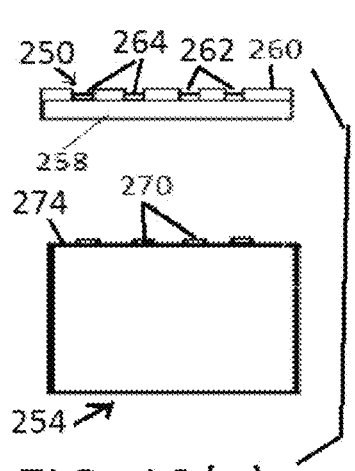
FIG. 12(a) is a sectional view of a further alternate embodiment IR detector array and a Si ROIC in a first stage of processing.

FIGS. 12(a) through 12(e) illustrates process steps for a modified direct bond interconnect process as applied to an IRFPA. FIG. 12(a) shows the starting components to be a prefabricated IR detector array 250 and a Si ROIC 254. The array 250 includes a detector 258, a pattered surface layer of ZnS 260 on the detector that defines windows 262 open to electrical connects 264 on the detector 258. The Si ROIC 254 includes electrical connects 270 on a top surface 274 thereof in a pattern corresponding to the electrical connects 264 of the detector 258. The heights of the connects 264, 270 are shown exaggerated for purposes of explanation in FIGS. 12(a)-12(d). The connects 264, 270 are not shown in FIG. 12(e).

Figure 12B:
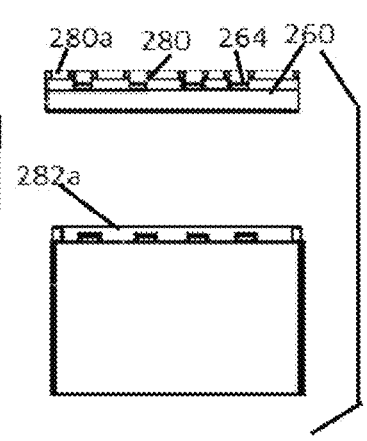
FIG. 12(b) is a sectional view of the further alternate embodiment of FIG. 12(a) in a second stage of processing.

FIG. 12(b) shows a patterned dielectric layer (e. g. oxide, nitride or oxynitride) deposited on the layer 260, pattered to expose the windows 262 and the electrical connects 264 through the windows 262, and forming collars or pillars 280 with the windows 262 exposed through a central region of the pillars.

The patterned dielectric layer also forms a surrounding wall or surrounding edge support 280a. A correspondingly shaped surrounding wall or surrounding edge support 282a is formed on the Si ROIC 254.

Figure 12C:
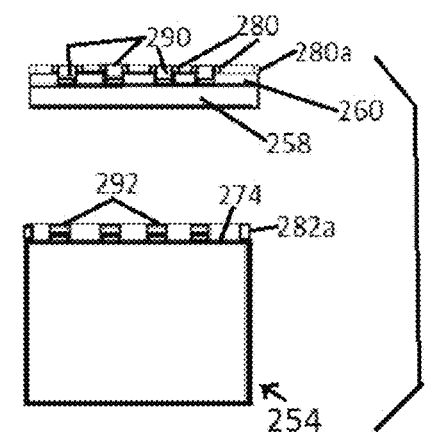
FIG. 12(c) is a sectional view of the further alternate embodiment of FIG. 12(a) in a third stage of processing.

FIG. 12(c) shows indium deposited on these components within the windows 262 and flush with top surfaces of the pillars 280, such as by a lithography step and lift-off process, forming microbumps 290 on the FPA 250. Indium is also deposited and patterned, such as by a lithography step and lift-off process, on the contacts 270, forming microbumps 292 on the Si ROIC 154.

Figure 12D:
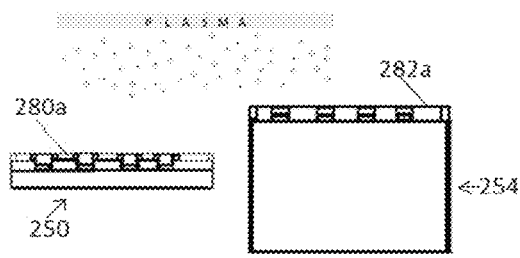
FIG. 12(d) is a sectional view of the further alternate embodiment of FIG. 12(a) in a fourth stage of processing.

FIG. 12(d) shows the dielectric regions 280a, 282a are then activated with treatment in plasma.

Figure 12E:
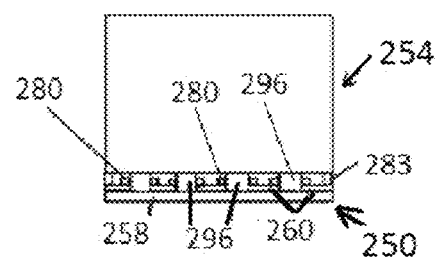
FIG. 12(e) is a sectional view of the further alternate embodiment of FIG. 12(a) in a fifth stage of processing.

FIG. 12(e) shows the activated surfaces 280a, 282a are then aligned and bonded together by a flip-chip process at room temperature. The microbumps 290, 292 are aligned and in electrical contact. The entire assembly can be annealed at higher temperatures, if necessary, in order to correct for any discontinuities in the metal interconnects 296 formed by the microbumps 290, 292.

FIGS. 12(a)-12(e) can depict the implementation of MoDiBI as applied to HgCdTe based IRFPA hybridization process. A prefabricated HgCdTe detector array 250 and a Si ROIC 254 receive deposition of a dielectric layer such as either oxide, nitride or oxynitride. Such dielectric layer will then be patterned to form the pillars 280 with open windows 262 in order to get access to the contacts 264 on the HgCdTe detector pixels, and the surrounding edge support 280a. The surrounding edge support 282a of a dielectric layer such as either oxide, nitride or oxynitride is formed on the ROIC 254. This is followed by a lithography step and lift-off process to pattern and deposit indium metal—an exemplary choice for the metal microbumps 290, 292. Subsequently, the patterned dielectric edge supports 280a, 282a are activated by means of a plasma treatment prior to being bonded together. After activation, the two dielectric surfaces 280a, 282a of the detector array 250 and Si ROIC 254 can be aligned by flip-chip process and bonded together at room temperature by minimal force. Any discontinuity in the indium interconnects 290, 292 due to any and all non-planarity and non-parallelism, potentially arising due to bow in the wafer or detector die can be mitigated in this approach by annealing the entire bonded assembly at higher temperature. At higher temperature, due to higher thermal expansion coefficient (TEC) than the mated/bonded dielectric the indium interconnect can easily expand to form indium-indium bond, forming the interconnects 96. Indium with high TEC ($33 \times 10^{-6}$/K) is suited for such application.

Figure 13:
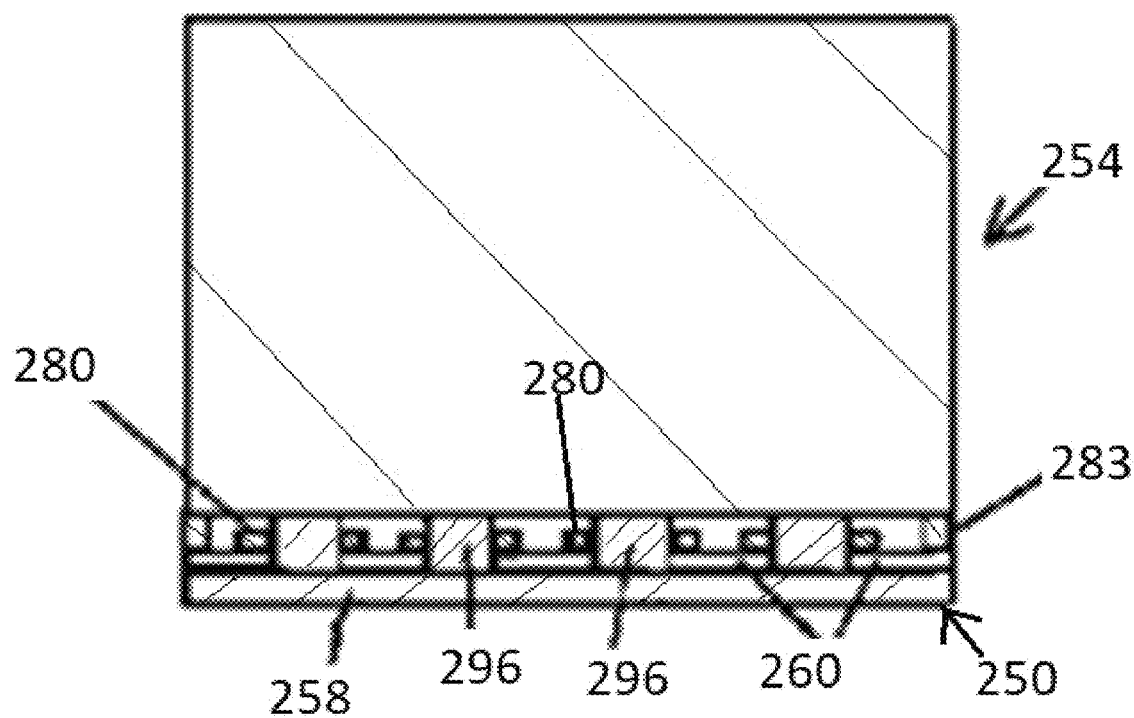
FIG. 13 is an enlarged view of the further alternate embodiment of FIG. 12(e)

FIG. 13 illustrates an enlarged view of the embodiment shown in FIG. 12(e).

Figure 14:
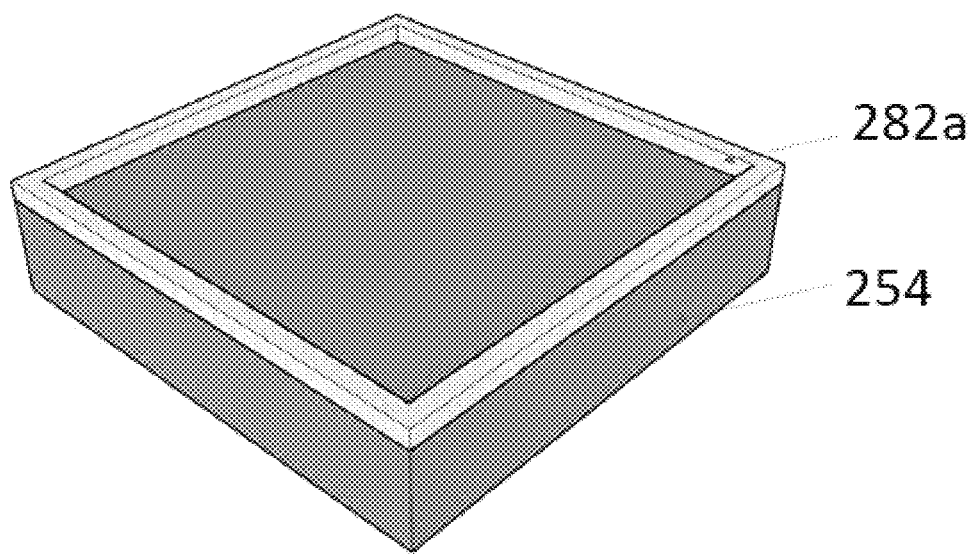
FIG. 14 is a perspective view of a portion of the further alternate embodiment taken from FIG. 12(b).

FIG. 14 illustrates the shape of the surrounding edge portion 282a on the ROIC 254. Some details have been omitted in this view. The surrounding edge support 280a on the detector array 250 would be identically sized and shaped to match up during assembly of the detector array 250 and the ROIC 254. Although a rectangular edge support is shown, other shapes are also encompassed by the invention.

While this invention is susceptible of embodiment in many different forms, there are shown in the drawings, and will be described herein in detail, specific embodiments thereof with the understanding that the present disclosure is to be considered as an exemplification of the principles of the invention and is not intended to limit this invention to the specific embodiments illustrated.

The invention claimed is:

1. A method of hybridizing an IRFPA having an IR component and a ROIC component and interconnects between the two components, comprising the steps of:
provinding an IR detector array and a Si ROIC;
depositing dielectric layers on the IR detector array and on the Si ROIC;
patterning the dielectric layers on both components to create openings to expose contact areas on each of the IR detector array and the Si ROIC;
depositing indium to fill the openings on both the IR detector array and the Si ROIC to create indium bumps, the indium bumps electrically connected to the contact areas of the IR detector array and the Si ROIC respectively and exposed on a top surface of the IR detector array and on the Si ROIC;
activating exposed dielectric layers on the IR detector array and the Si ROIC in a plasma; and
closely contacting the indium bumps of the IR detector array and the Si ROIC while bonding together the exposed dielectric surfaces of the IR detector array and the Si ROIC.

2. The method according to claim 1, wherein the step of closely contacting the indium bumps and the IR detector array includes a flip-chip process.

3. The method according to claim 1, comprising the further step of annealing the IR detector array and a Si ROIC after the indium bumps are contacted.

4. The method according to claim 1, wherein the step of depositing dielectric layers is further defined in that $Al_2O_3$ is used for the dielectric layers.

5. The method according to claim 1, wherein the step of depositing dielectric layers is further defined in that $SiO_2$ is used for the dielectric layers.

6. A method of hybridizing an IRFPA having an IR component and a ROIC component and interconnects between the two components, comprising the steps of:
providing an IR detector array with first electrical contacts and a Si ROIC with second electrical contacts;
depositing a dielectric layer on the IR detector array;
patterning the dielectric layers on the IR detector array to create openings to expose the first electrical contacts;
depositing indium to fill the openings on the IR detector array in electrical contact with the first electrical contacts to create first indium bumps, and depositing indium on the second electrical contacts of the Si ROIC to create second indium bumps, the first and second indium bumps exposed on mating surfaces of the IR detector array and on the Si ROIC; and
closely contacting the indium bumps of the IR detector array and the Si ROIC to form electrical interconnects between the IR detector array and the Si ROIC.

7. The method according to claim 6, wherein the step of depositing indium on the second electrical contacts of the Si ROIC to create second indium bumps is further defined in that the second indium bumps extend from a surface of the Si ROIC without a surrounding dielectric.

8. The method according to claim 7, wherein the step of patterning the dielectric layers on the IR detector array to create openings to expose the first electrical contacts is further defined in that the dielectric layer is pattered to create spaced apart pillars, each pillar surrounding a first indium bump.

9. The method according to claim 8, wherein the step of patterning the dielectric layers on the IR detector array to create openings to expose the first electrical contacts is further defined in that a first dielectric edge support is deposited on the IR detector array; and
comprising the further steps of depositing a second dielectric edge support on the Si ROIC, the first and second dielectric edge supports having matching sizes and shapes, and activating the first and second dielectric edge supports on the IR detector array and the Si ROIC in a plasma; and
the step of closely contacting the indium bumps of the IR detector array and the Si ROIC to form electrical interconnects between the IR detector array and the Si ROIC is further defined in that the first and second dielectric edge supports are bonded during the step of closely contacting the indium bumps.

10. The method according to claim 6, wherein the step of patterning the dielectric layers on the IR detector array to create openings to expose the first electrical contacts is further defined in that a first dielectric edge support is deposited on the IR detector array; and
comprising the further steps of depositing a second dielectric edge support on the Si ROIC, the first and second dielectric edge supports having matching sizes and shapes, and activating the first and second dielectric edge supports on the IR detector array and the Si ROIC in a plasma; and
the step of closely contacting the indium bumps of the IR detector array and the Si ROIC to form electrical interconnects between the IR detector array and the Si ROIC is further defined in that the first and second dielectric edge supports are bonded during the step of closely contacting the indium bumps.

11. The method according to claim 6, wherein the step of closely contacting the indium bumps and the IR detector array includes a flip-chip process.

12. The method according to claim 6, comprising the further step of annealing the IR detector array and a Si ROIC after the indium bumps are contacted.

13. The method according to claim 6, wherein the step of depositing the dielectric layer is further defined in that $Al_2O_3$ is used for the dielectric layer.

14. The method according to claim 6, wherein the step of depositing the dielectric layer is further defined in that $SiO_2$ is used for the dielectric layer.

* * * * *